(12) United States Patent
Krassnitzer

(10) Patent No.: US 7,678,240 B2
(45) Date of Patent: *Mar. 16, 2010

(54) METHOD FOR CONTROLLING PLASMA DENSITY OR THE DISTRIBUTION THEREOF

(75) Inventor: Siegfried Krassnitzer, Feldkirch (AT)

(73) Assignee: OC Oerlikon Balzers AG, Balzers (LI)

( * ) Notice: Subject to any disclaimer, the term of this patent is extended or adjusted under 35 U.S.C. 154(b) by 46 days.

This patent is subject to a terminal disclaimer.

(21) Appl. No.: 12/053,299

(22) Filed: Mar. 21, 2008

(65) Prior Publication Data

US 2008/0210548 A1 Sep. 4, 2008

Related U.S. Application Data

(60) Division of application No. 10/967,383, filed on Oct. 18, 2004, now Pat. No. 7,368,041, which is a division of application No. 10/225,717, filed on Aug. 20, 2002, now Pat. No. 6,821,397, which is a continuation of application No. PCT/CH01/00021, filed on Jan. 12, 2001.

(30) Foreign Application Priority Data

Feb. 23, 2000 (CH) ........................................ 351/00

(51) Int. Cl.
*C23C 14/35* (2006.01)

(52) U.S. Cl. .............................. 204/192.12; 204/298.16; 204/298.19; 204/298.2; 204/298.14

(58) Field of Classification Search ............ 204/192.12, 204/298.16, 298.17, 298.18, 298.19, 298.2, 204/298.14

See application file for complete search history.

(56) References Cited

U.S. PATENT DOCUMENTS 7,368,041 B2 * 5/2008 Krassnitzer ............ 204/192.12

* cited by examiner

*Primary Examiner*—Rodney G McDonald
(74) *Attorney, Agent, or Firm*—Nataro & Michalos P.C.

(57) ABSTRACT

Magnetron source has a target configuration with a sputter surface, a magnet configuration generating above the sputter surface a magnetic field which forms, in top view onto the sputter surface, at least one magnet field loop. Viewed in a cross-sectional direction upon the target configuration, a tunnel-shaped arc magnet field is formed and further an electrode configuration is provided which generates, when supplied by a positive electric potential with respect to an electric potential applied to the target configuration, an electric field which crosses at an angle the magnetic field and wherein the electrode configuration comprises a distinct electrode arrangement in a limited segment area of the electrode configuration, which is substantially shorter than the overall length of the magnet field loop. The electrode arrangement along the limited segment area is electrically isolated from the remainder of the electrode configuration so as to be electrically operated differently than the remainder of the electrode configuration.

15 Claims, 12 Drawing Sheets

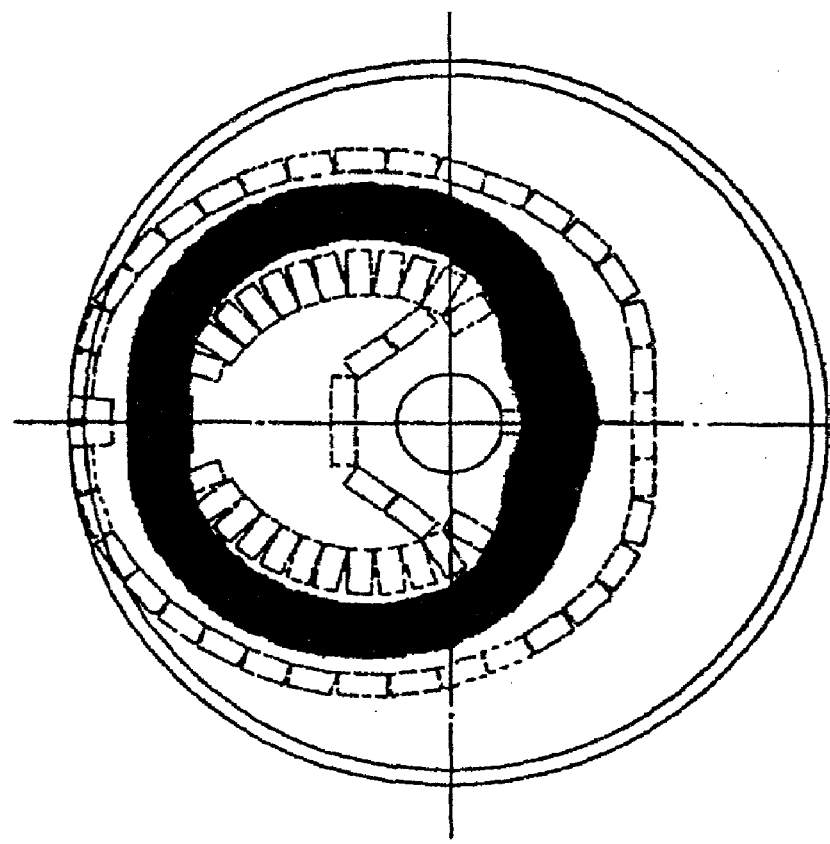
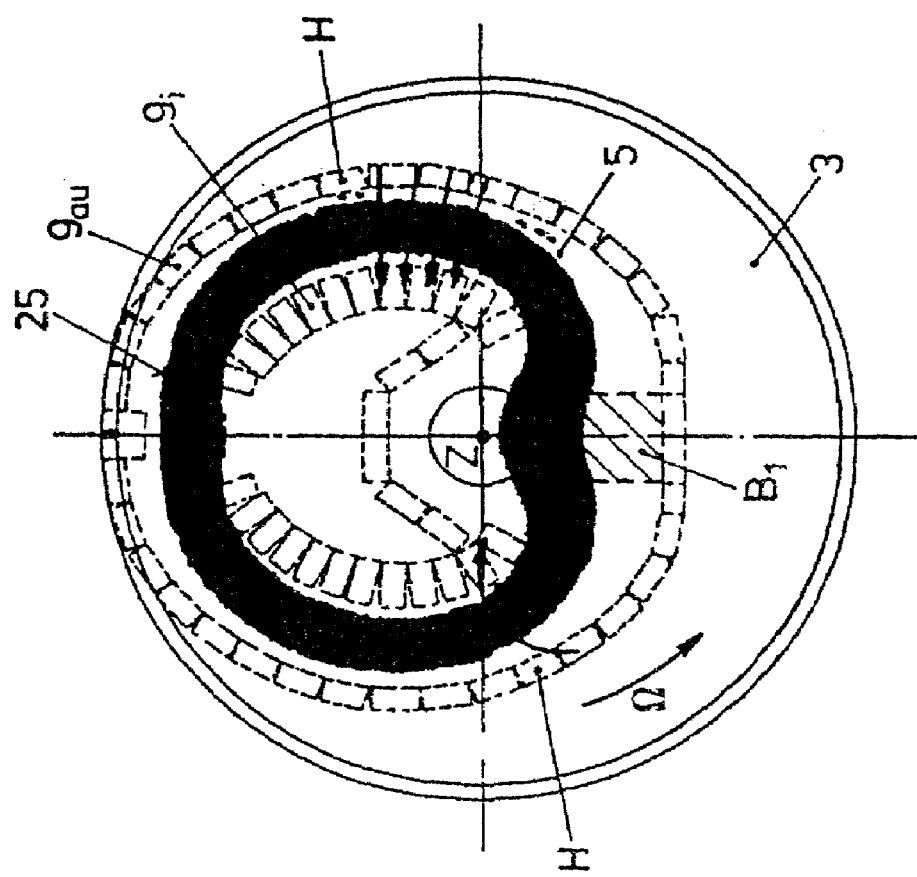
FIG.11(a)
FIG.11(b)

METHOD FOR CONTROLLING PLASMA DENSITY OR THE DISTRIBUTION THEREOF

CROSS-REFERENCE TO RELATED APPLICATION

This is a divisional of U.S. application Ser. No. 10/967,383 filed Oct. 18, 2004, now U.S. Pat. No. 7,368,041, which was a divisional of U.S. application Ser. No. 10/225,717 filed Aug. 20, 2002, now U.S. Pat. No. 6,821,397, which was a continuation of PCT/CH 01/00021 filed Jan. 12, 2001, which are all incorporated here by reference, and which claim priority on Swiss application No. 351/00 filed Feb. 23, 2000, which priority is reported here.

FIELD AND BACKGROUND OF THE INVENTION

The present invention relates to a method for controlling plasma density or its distribution over the target configuration of a magnetron source, a method for the production of coated workpieces, as well as magnetron sources.

Definition

By magnetron source is understood a sputter source, on which the discharge is operated with DC, AC or mixed AC and DC, or with pulsed DC, wherein AC is to be understood as extending up into the HF range. The source is conventionally operated under vacuum with a working gas, such as for example argon, at pressures of a few mbar up to $10^{-3}$ mbar. In known manner, reactive additional gases can be mixed in for reactive processes.

Over the sputter surface of the target configuration at a magnetron source, a tunnel-form magnetic field is generated, which, in a view onto the surface to be sputtered, the sputter surface, forms a closed loop. Viewed in the cross sectional direction of the target configuration, at least a portion of the magnetic field emerges from the sputter surface and enters back into it again in the form of a tunnel arch. The sputter surface, also referred to as the target surface, forms the one electrode, the cathode, of the plasma discharge gap, since positive ions must be accelerated onto the target surface for the sputtering process. This electrode can also be subdivided and its components can be individually electrically supplied.

Consequently, in the region of the loop of the tunnel-form magnetic field an electric field obtains, which is substantially at an angle with respect to the tunnel field. A tunnel-form electron trap results and a pronounced electron current, which substantially circulates in and along the loop of the tunnel-form magnetic field. In the region of said loop-form circulating magnetic field this electron current produces a pronounced increase of the plasma density compared to the plasma density further outside of said magnetic field loop.

Therewith along the circulating electron current, referred to in the technical field as "race track" a substantially increased sputter rate, results which leads to an increasingly more developed erosion trench in the sputter surface, i.e. at the base of the tunnel-form circulating magnetic field.

Apart from fundamentally the great advantages of magnetron sources, this increasingly developing erosion trench, has negative effects on Coating homogeneity on the coated substrate,
Degree of utilization of the target material.

In order to avoid at least partially these disadvantages, it is known to move, in particularly cyclically, entire or major portions of the magnetic field circulating tunnel-form in a loop with respect to the target configuration or its sputter surface. Thereby is obtained a temporal distribution of the "race track" electron current effect along the traversed sputter surface regions.

If it is taken into consideration that the looped magnetic field circulating in the form of a tunnel is conventionally realized by a configuration of strong permanent magnets beneath the target configuration, it is evident that, on the one hand, an existent permanent magnet configuration which, for shifting said magnetic field, is mechanically moved beneath the target configuration, can only be geometrically changed with relatively high expenditures, in order to realize different erosion profile distributions, and that in sputter operation a variation of this distribution or of the geometry of the permanent magnetic configuration is hardly possible.

SUMMARY OF THE INVENTION

The present invention addresses the problem of being able to control the plasma density or plasma density distribution over the sputter surface of the target configuration differently or additionally and therein also to be able to carry out this control during the coating process.

This is achieved with the method of the above described type thereby that locally, i.e. along a limited partial segment of the circulating loop of the tunnel-form magnetic field, this magnetic field and/or the electric field is varied under control. In a second solution formulation the posed problem is solved thereby that onto the tunnel-form magnetic field basically a controlling magnetic field is superimposed. Under the first formulation, the corresponding field is thus locally varied, under the second an additional magnetic field is superimposed onto the tunnel-form one.

U.S. Pat. No. 5,512,150 discloses a magnetron sputter source, in which the tunnel-form magnetic field over the target configuration can be varied with respect to its radial extension. For this purpose beneath the target configuration an electromagnet is disposed in the form of a pot, whose poles can be reversed by reversing the current direction. This electromagnet itself generates the tunnel-form magnetic field: for that reason, it must be extremely strong, which leads to a large voluminous coil with corresponding heat development.

The disadvantages of this known process according to the invention are circumvented under both formulations.

It was found according to the invention that through the exclusively local change of the electrical and/or of the tunnel-form magnetic field the electron trap is more or less disturbed, which corresponding to the particular operating point and the selected variation, leads to an increase or decrease of the plasma density along the entire electron trap.

With respect to the average periphery of the electron trap therein the described local intervention is realized in a peripheral region, in top view, of maximally ⅓ of the perimeter, preferably on a region of maximally ¼ of the perimeter, preferably in a region which is significantly shorter.

Relative to the average pole distance d of the pole regions out of which the tunnel-form magnetic field emerges from the sputter surface and enters it again, a preferred length $l_B$ of the "local" region on which the intervention is carried out, preferably results as:

$0 < l_B \leq 4\,d$ preferably $0 < l_B \leq 2\,d$ in particular of $0 < l_B \leq d.$ When the term "local" is used, then preferably with the above addressed geometric reference to average loop perimeter and/or to average pole distance, in particular averaged in the considered intervention region.

Even if, under the second formulation of the present invention, onto the tunnel-form magnetic field a controlling magnetic field is superimposed no longer necessarily locally, such that the degree to which the anode intervenes in the resulting magnetic field is varied under control, a controlling effect is exerted onto the action of the electron trap and the circulating electron current and consequently onto the plasma density and sputter rate along the entire circulating loop.

According to the first listed formulation of the present invention in a preferred embodiment the tunnel-form magnetic field and/or the electric field is varied locally with control such that said degree is varied.

Since according to the first formulation of the invention the magnetic field and/or the electric field is only locally intervened upon, it is entirely possible to vary the tunnel-form magnetic field and/or the electric field through the controlling intervention on their particular generators themselves, thus without superposition.

If, according to the second formulation of the invention onto the circulating tunnel-form magnetic field a controlling magnetic field is superimposed, this takes place in a preferred embodiment along at least one major portion of the loop of the tunnel-form magnetic field. The superimposed field is preferably established substantially perpendicularly to the target sputter surface and, in a further preferred embodiment, substantially homogeneously, i.e. with locally constant field strength distribution. But it is entirely possible to develop this superimposed field also locally of different amplitude and/or to vary it such that its controlling strengths differ.

The two formulations, according to the invention, can be entirely realized in combination.

In terms of equivalent circuit diagram, varying the circulating electron current can be considered a variation of the plasma impedance of the particular discharge zone or loop.

If, in source operation, on a target configuration more than one electron trap is provided with the particular magnetic field loop, this can be considered as a parallel circuit of the plasma impedances associated with the tunnel field loops. This leads to a further highly advantageous effect of the present invention: if the control according to the invention —according to one or according to both stated aspects—is employed at least with one of the electron traps, this manifests itself as a control of an impedance of an impedance parallel circuit, from which results a control of the current distribution onto the parallel impedances. Consequently, a control and corresponding redistribution of the plasma densities, sputter powers and sputter rates on the provided loops or electron traps takes place. In the case of the at least two electron traps under consideration, one can be disposed within the other, or they can both be adjacent to one another.

Furthermore, in a further preferred embodiment the at least one electron trap with its loop of the tunnel-form magnetic field is moved during operation over the target configuration or its sputter surface, preferably under control and preferably cyclically, be that for example in a pendulum-like or in a continuous circulating movement.

In particular under the first aspect—application of a local controlling change—with the variation the form of the loop of the electron trap is varied under control, preferably cyclically or according to another temporal program, or the electron trap—also under the second aspect—under control, preferably cyclically or according to another temporal program, is attenuated or augmented, up to their switching off or on.

The control according to the invention can take place in discrete steps or continuously. If two of said control variables, magnetic field and electric field, are employed simultaneously, discrete control and continuous control can, if appropriate, be combined.

In a preferred embodiment, in particular according to the first solution formulation of the present invention, for the controlled variation of the magnetic field a controllable electromagnet configuration and/or a permanent magnet configuration, movable under mechanical control, and/or a ferromagnetic shunt configuration is employed, if appropriate, in combination.

If, further, the case is considered of one or several electron traps shifted or moved during operation over the sputter surface, a preferred embodiment is obtained thereby that the controlling electromagnet and/or permanent magnet configuration and/or shunt configuration together with the electron trap(s) is(are) moved. Necessary current supplying can be realized for example via slip rings, in particular under consideration of the low necessary driving powers.

In particular under the second formulation of the present invention, in which not necessarily only locally but preferably over significant regions of the tunnel magnetic field, circulating in the form of a loop, a control magnetic field is superimposed onto it, the superimposed control magnetic field is preferably provided fixed at the source.

The invention relates further to a production method for coated workpieces. Magnetron sputter sources according to the invention are distinguished for the solution of the underlying problem according to other features of the invention and preferred embodiments of the invention. Here also other claimed measures can be employed in combination.

With a sputter coating chamber according to the invention or a vacuum treatment installation as claimed, based on the approach according to the invention highly advantageous vacuum treatments can be carried out, always with the inclusion of the magnetron sputtering according to the invention, wherein substrates result with optimized layer thickness distribution and/or distribution of the layer composition, whose realization until now had only been possible with considerably more expensive procedures.

It should be emphasized at this point that it is understood that the inventive methods, production methods, magnetron sputter sources, vacuum treatment chambers and the vacuum treatment installation according to the invention can also be applied within the framework of reactive coating methods, in which the materials sputtered off the target configuration react with a plasma-activated reactive gas, which is deposited as coating material on the particular substrate(s).

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the following the invention will be explained by example in conjunction with Figures. Therein depict.

DESCRIPTION OF THE PREFERRED EMBODIMENTS

Figure 1:
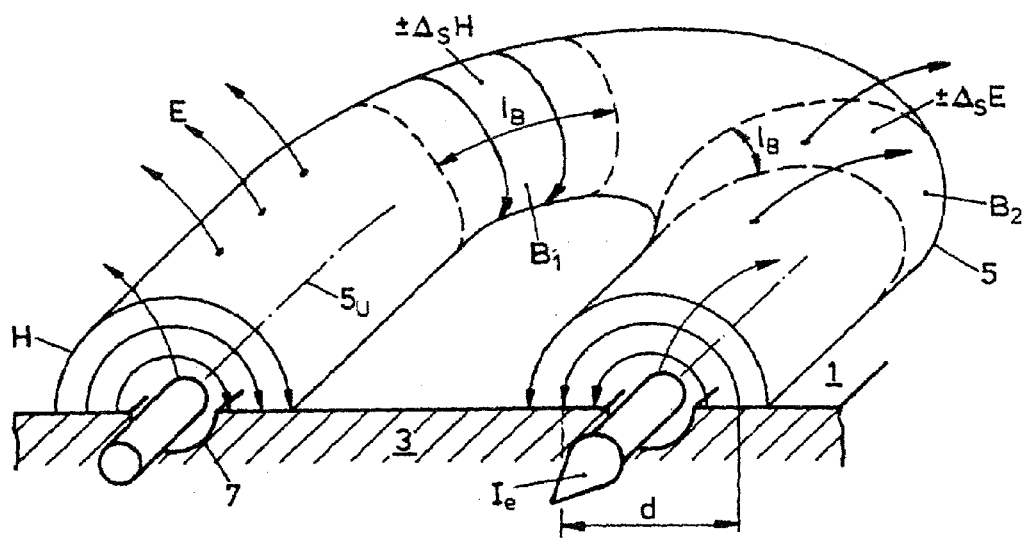
FIG. 1 schematically illustrates a section of a target of a magnetron source with a tunnel-form magnetic field, generated thereabove in a closed loop, of an electron trap depicting a first formulation of the process according to the invention, FIG. 2 schematically illustrates a first embodiment of a magnetic field driving according to the invention realized on the electron trap according to FIG. 1.

In FIG. 1, schematically and without claiming scientific exactness, the conditions are depicted in the case of realization of the invention under its first formulation. Over the sputter surface 1 of a target configuration 3, in a manner not further shown here, for example with two collars of permanent magnets disposed beneath the target configuration 3, a tunnel-form magnetic field H is generated, which circulates in a closed loop 5 over the sputter surface 1.

In the zone of the loop 5 further an electric field E intersecting the magnetic field H at an angle is built-up between the target configuration as the cathode and a discharge anode (not shown) provided in known manner. Based on these field conditions, an efficient electron trap develops, which produces a well-known electron current $I_e$, which substantially circulates in the magnetic field loop 5 and is substantially greater than the plasma discharge current away from said tunnel-form field. Based on the high electron current density obtaining at this location, a high plasma density is obtained here, an increased local sputter rate and, lastly, a sputter erosion trench 7 in the sputter surface 1.

Under said first formulation of the present invention, now locally in region $B_1$ along the magnetic field loop 5 the tunnel-form magnetic field H obtaining there is disturbed or varied with control $\pm\Delta_S H$, and/or the electric field E is disturbed or changed with control and locally as is shown with $\pm\Delta_S E$ in region $B_2$. Both of said control variables can be employed singly or in combination, in separate regions $B_1$ and $B_2$ or in the same region $B_{12}$. Through this local intervention the effect of the electron trap is drastically disturbed or varied over the entire circulating loop.

If, according to FIG. 1, the entire average perimeter U of loop 5 is considered, of which at $5_u$ a portion is drawn in FIG. 1, and which corresponds substantially to the perimeter of the trench 7, it can be stated for the length $I_B$ at $B_1$ or $B_2$ that $I_B \leq \frac{1}{3}$ U, preferably $I_B \leq \frac{1}{4}$ U, preferably significantly smaller.

Figure 2:
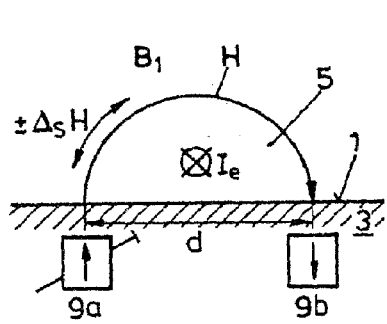

Relative to the average pole distance d, which corresponds substantially to the distance of the magnetic poles (s. FIG. 2) forming the tunnel-form magnetic field H, then for $I_B$ preferably applies:

$$0 < I_B \leq 4\,d$$

preferably $$0 < I_B \leq 2\,d$$

in particular $$0 < I_B \leq d.$$

Figure 3:
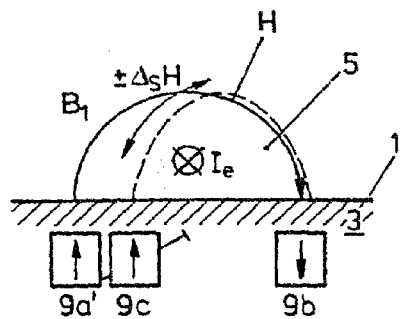
FIG. 3 is a representation analogous to FIG. 2, of a second, most preferred embodiment.
Figure 4:
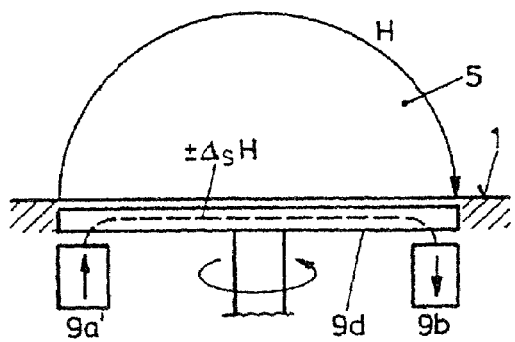
FIG. 4 illustrates a third embodiment in a representation analogous to FIGS. 2 and 3 with the application of a shunt.

In further consideration of said first inventive formulation schematic options are represented in FIGS. 2, 3 and 4, for changing with control the magnetic field H locally in region $B_1$ according to FIG. 1.

Shown in simplified manner in FIG. 2 is depicted a partial cross section through the configuration of FIG. 1 with the loop-form circulating tunnel magnetic field H. The same reference symbols as in FIG. 1 are employed. The magnetic field H is here generated through collars of magnets 9a or 9b provided under the sputter surface 1 in or beneath the target configuration 3, circulating substantially as the magnetic field loop 5. While the magnetic field H is generated by permanent magnets, according to FIG. 2 in the depicted region $B_1$ is developed such that it is variable under control of at least one of the field-generating magnets 9a. This can be realized by providing locally an electromagnet configuration or by a local configuration with permanent magnet movable under control, whose movement permits for example changing its effective strength or polarization direction with respect to the "main" magnets disposed next to region $B_1$ of the considered collar. A further option will be discussed in connection with FIG. 4.

Consequently according to FIG. 2 the magnetic field change $\pm\Delta_S H$ employed according to the invention after FIG. 1 can be realized locally through the H field-generating magnetic configuration itself.

In FIG. 3 in a representational manner analogous to FIG. 2 is depicted a further realization form of the invention under its first formulation, in which again locally in region $B_1$ (FIG. 1) the magnetic field H is changed under control. As is readily evident by cross comparison with FIG. 2, here the magnetic configurations 9$a'$ and 9$b$ generating the loop-form circulating tunnel magnetic field H are not varied in the case of the control according to the invention, but rather locally a further magnetic configuration, for example a drivable magnet 9$c$, is provided, which generates a field superimposed onto the magnetic field H. The result of the superposition of the unchanged field H with the superimposed control magnetic field leads again to the field change $\pm\Delta_S H$ utilized according to the invention in region $B_1$. The magnet configuration 9$c$ can again be realized through an electromagnet configuration and/or through a permanent magnet configuration moved under mechanical control, but wherein, in comparison to the embodiment according to FIG. 2, these magnet configurations in any case only need to generate the control field and consequently can be developed significantly weaker than according to FIG. 2.

In a representation in FIG. 4, analogous to FIGS. 2 and 3, a further variant is depicted for changing according to the invention the tunnel-form field H. For this purpose the magnets 9$a'$ or 9$b$ according to FIG. 3, which jointly generate field H, are more or less magnetically shunted under control. For example and according to FIG. 4, a bar-form ferromagnetic shunt element is activated or deactivated while driven under mechanically control. For this purpose for example the bar-form ferromagnetic shunt element 9$d$ is rotated from the depicted full-shunt position into the "shunt off" position extending transversely to it.

The realization option depicted schematically in the following FIG. 5 will be addressed, furthermore following the invention under its first formulation but with field E controlled according to the invention and locally varied.

Figure 5:
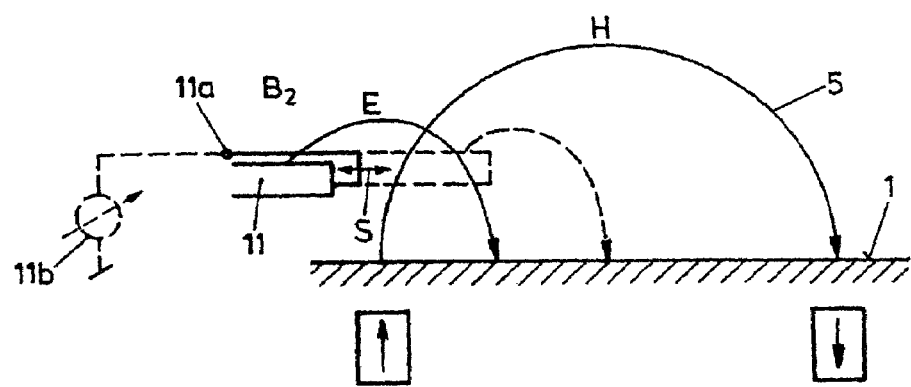
FIG. 5 is a representation analogous to FIGS. 2 to 4, of a realization of the driving according to the invention with controlled variation of the electric field conditions.

According to FIG. 5, a representation analogous to FIGS. 2 to 4, the tunnel-form H field is not varied. Instead, in a region $B_2$ according to FIG. 1, preferably dimensioned with respect to U or d as stated above, the E field is locally changed at the cathodic sputter surface 1. For this purpose the anode 11 comprised of non-ferromagnetic material in region $B_2$ is slid into the tunnel-form magnetic field H or retracted from it as represented with S. For this purpose in region $B_2$ the anode 11 is developed as a motor-controlled subanode 11$a$. In addition to the mechanical movability or instead of it, the subanode 11$a$ can be connected to a potential which is variable under control, as is depicted with the adjustable source 11$b$.

If an anodic part, such as the mechanically movable part 11$a$, is activated relative to the magnetic field H such that it intervenes upon this magnetic field controlled to a different degree, then—extremely reasonably—the electron trap is disturbed drastically, the loop current flows off via this subanode. This takes place even if through controlled changing of the magnetic field H (FIGS. 2-4) the magnetic field H of an electron trap proximal to an anode part is deformed toward it or if this (FIG. 5) takes place through the controlled effect of an anodic part or also, when proceeding according to the second formulation, if the anode-proximal electron trap under control entirely or in subsections is cut into by the discharge anode or an anodic part.

The utilization of this effect is especially suitable for the switching on/off of an electron trap. Viewed conversely, thus electron traps which are in the proximity of the anode part are especially suitable to be driven on/off by switching according to the invention. Electron trap more remote from the anode part, in contrast, are rather more suitable for driving according to the invention for their continuous or switched form change through local magnetic field change.

Figure 6:
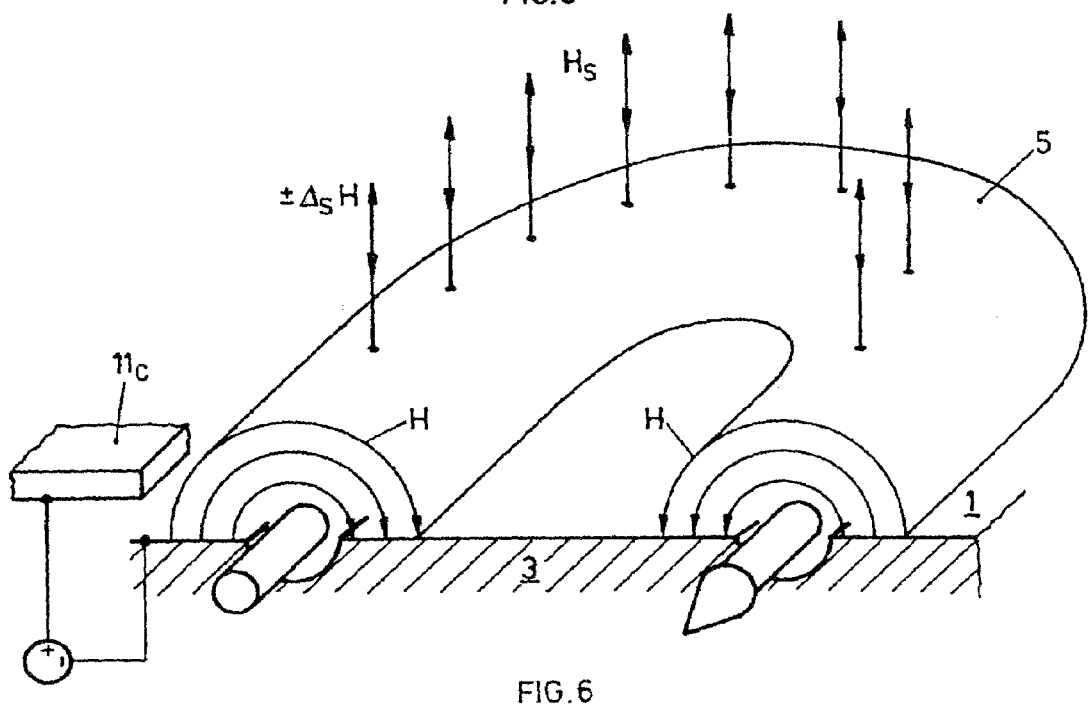
FIG. 6 is a representation analogous to FIG. 1 of the realization of the present invention according to a second formulation with superposition of a control magnetic field.

In a representation analogous to that of FIG. 1, in FIG. 6 is depicted the process according to the invention following the second formulation. For the variables already depicted in FIG. 1 and described, the same reference symbols are applied. Accordingly, no longer locally but rather over significant regions, even the entire region, of the tunnel-form magnetic field H circulating in the form of a loop, thus preferably along the entire loop 5, onto this magnetic field H a control magnetic field $H_S$ is superimposed, adjustable under control as depicted with $\pm\Delta_S' H$. This field does not need to be, but preferably is, realized substantially perpendicularly to the sputter surface 1. It does not need to be, but is, additionally preferably established homogeneously, i.e. with constant field strength.

Since, according to FIG. 6, the control magnetic field $H_S$ is only responsible for variations of the loop-form circulating tunnel magnetic field H and not for its development proper, the magnets (not shown) generating this control magnet field $H_s$ can be developed to be significantly weaker than is necessary for example when proceeding according to U.S. Pat. No. 5,512,150.

In FIG. 6 is depicted schematically an anodic part 11$c$. Due to the effect of field $H_S$ the electron trap is entirely or in a subsegment more or less strongly cut into through the anode part 11$c$—in a segment of loop 5 or on its entire periphery, thus for example the conventionally provided discharge anode of the source—with which the electron trap effect is massively disturbed.

In an especially preferred embodiment—in order to utilize the source anode—the process according to FIG. 6 is applied at an electron trap with magnetic field H circulating in the form of a loop, which is localized at the sputter surface 1 in the outermost, the peripheral, region. The control magnetic field $H_S$ in this case is preferably realized by means of a peripherally encircling Helmholtz coil, as will be explained later.

In FIG. 7, again schematically, the top view is depicted onto a magnetron source according to the invention or a magnetron source controlled according to the invention is shown. Beneath the target configuration 3, which is mounted under insulation for example in a source frame 4 with the anode, a magnet configuration 9 with permanent magnet collars 9$_i$ and 9$_{au}$ disposed oppositely poled is provided, with the polarization directed substantially perpendicularly to the sputter surface 1 of the discrete permanent magnets 10. The exemplary orientation of the magnetic dipoles of the permanent magnets 10 are depicted at $D_{9i}$ as well as $D_{9au}$.

The permanent magnet collars 9$_i$ and 9$_{au}$ generate the loop 5 of the circulating tunnel-form magnetic field H. Following the first formulation of the present invention explained in conjunction with FIG. 1, more precisely that according to FIG. 3, a control magnet configuration 9$c$ is provided, which generates a magnetic dipole $D_S$. The magnet configuration 9$c$ generating this dipole $D_S$ in this embodiment example is developed as a permanent magnet configuration mechanically movable under control and, especially preferred and as depicted with ω, rotated motor-driven about an axis A substantially parallel to the plane $F_9$ defined by the magnet collars 9$_i$, 9$_{au}$. The axis A in a further preferred embodiment, and as will yet be described, is disposed highly advantageously substantially in the planes of projection of the local tunnel-form magnetic field H onto the plane $F_9$. Through the controlling rotation of dipole $D_S$, analogously to the adjustment of the magnet configuration 9$c$ of FIG. 3, up to its direction inversion, in region $B_1$ the magnetic field H obtaining here is locally varied by $\pm\Delta_S H$ under control. As has been explained, therewith the electron trap and the electron current $I_e$ according to FIG. 1 circulating in loop 5 of the tunnel-form magnetic field H starting from an operating point, for example directed inactive with $D_S$, is more or less disturbed, with which the plasma impedance and at constant feed the plasma density in the loop 5 under consideration is varied. At a preset fixed anode/cathode voltage of the source, through the corresponding dimensioning of dipole $D_S$ and its controlled orientation, the plasma discharge in said loop 5 can be drastically disturbed. With the electron trap, as depicted, in the proximity of the anode, virtually the switching on/off of the electron trap effect takes place.

Figure 7:
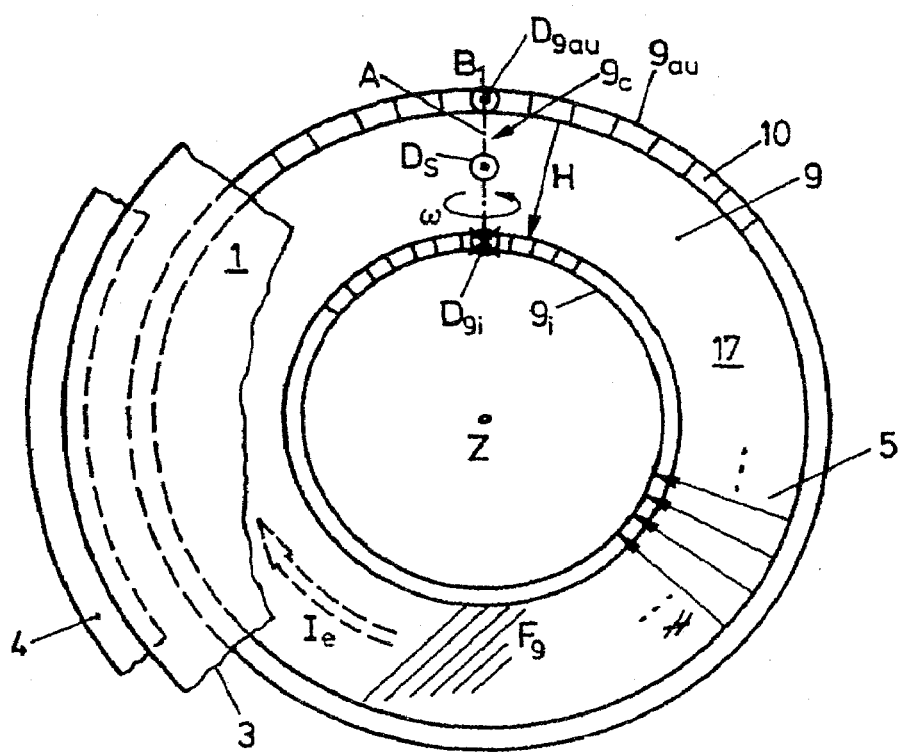
FIG. 7 is a schematic top view of a magnetron sputter source according to the invention with partially cut-away target configuration and realization of the procedure according to the invention essentially according to FIG. 3, therein in a preferred embodiment, FIG. 8 schematically illustrates the realization form according to FIG. 7 at a rectangular target.
Figure 8:
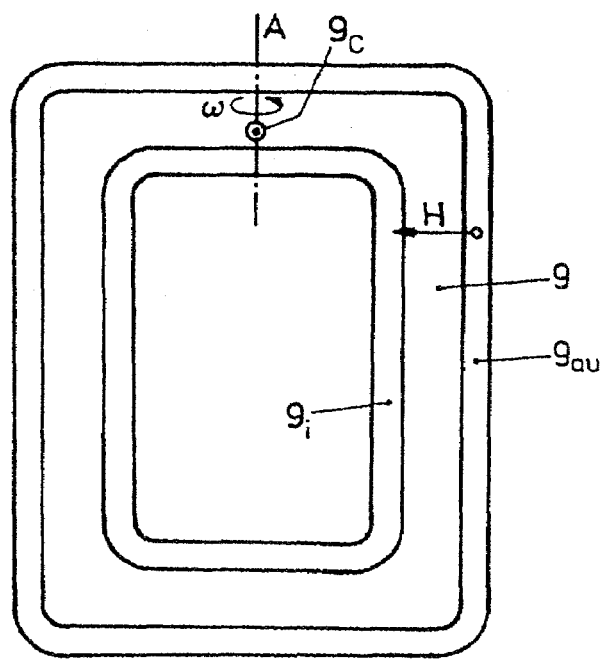

Even if, according to FIG. 7, the target configuration 3 as well as the magnetic collars $9_i$ and $9_{au}$ are developed circularly, it is readily possible, as shown in FIG. 8, to provide rectangular or differently formed target configurations 3 and correspondingly formed magnet collars and therein to provide the control according to the preceding explanations according to the invention, for example according to FIG. 7.

Figure 9:
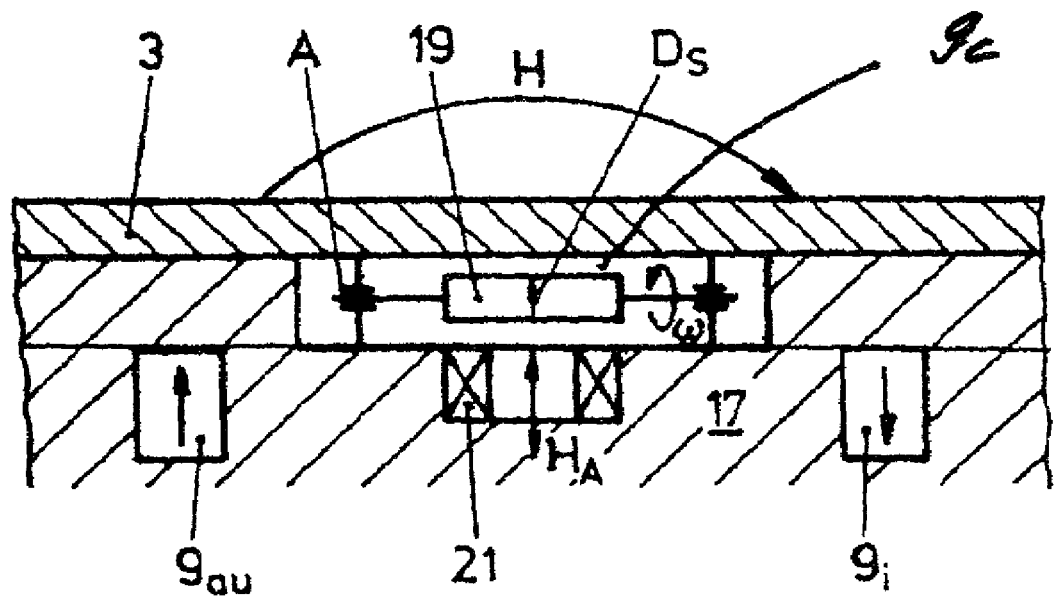
FIG. 9 is a schematic side view of a preferred realization of the driving according to the invention according to FIG. 7.

In FIG. 9, furthermore schematically, is depicted a realization form preferred today of the control magnet configuration 9c explained in conjunction with FIG. 7. On the support plate 17, on which the magnetic collars $9_{au}$ and $9_i$ are installed, a magnet cylinder 19 is pivotably supported polarized with dipole $D_S$, driven rotationally movably about rotational axis A and, as explained, oriented with respect to the magnetic field H. Its driving takes place via a driving coil 21, which under control generates a driving field $H_A$. Due to the relative position of the magnet cylinder 19, its dipole $D_S$, the cylinder 19 can be rotated with respect to the magnetic field H, in spite of this strong magnetic field H, by overcoming a torque, which is extremely small, such that with coil 21 a driving field $H_A$ which is low can be generated. With this configuration and poling of the fields or the magnets, the magnetic field H enhances the rotational movement of the cylinder 19 and the maintenance of a stable end position. In order to ensure that the magnetic cylinder 19 with respect to the driving field $H_A$ never pivots into a position neutral in terms of torque,—as is depicted schematically in FIG. 10—the rotational movement of the magnet cylinder 19 is preferably resiliently pretensioned, which also makes possible to drive the magnet cylinder 19 continuously into any desired dipole angular position and in this way to carry out a steady or continuous control according to the invention. This is applied primarily on electron traps further removed from the anode; controlled deformation and/or continuous effect change occurs of the or at the electron trap.

Figure 10:
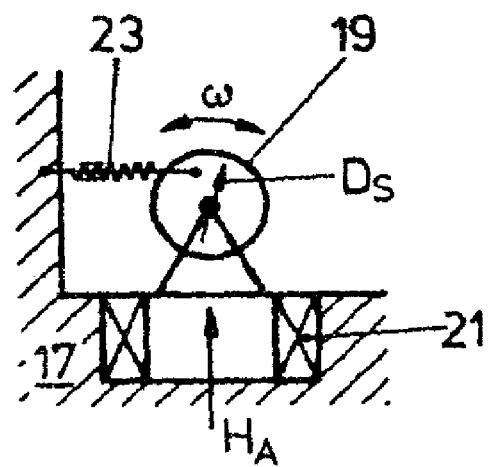
FIG. 10 is a side view of the preferred embodiment according to FIG. 9, FIGS. 11(a) and 11(b) illustrate the effects of the driving according to the invention onto the plasma density or its distribution at a magnetron source structured substantially according to FIG. 7, FIGS. 12(a) and 12(b) are representations analogous to FIGS. 11(a) and 11(b) of a further example of the effects of the driving according to the invention onto the plasma density distribution.

According to FIG. 10, for example, a spring member 23, for example a coil spring, which acts between support plate 17 and magnet cylinder 19, is provided on axis A.

In FIG. 7 an embodiment is depicted, in which the permanent magnet collars 9 and $9_{au}$ are circular and stationary with respect to the target configuration 3.

But, as already explained in the introduction, it is known to move the magnet collars beneath the target configuration 3 as an entire unit and in this way to shift the electron trap or the loop 5 of the tunnel-form magnetic field H during operation over the sputter surface 1. This is conventionally realized in a pendulum-type or circulating or rotating controlled movement. In this case, however, as is readily evident, the magnet collars corresponding to $9_i$, $9_{au}$ are no longer, as depicted in FIG. 7, developed annularly or no longer concentrically with respect to the center Z of target configuration 3. Rather, in this case they are conventionally developed such that they are oval, heart- or kidney-shaped. In the above discussed embodiment, consequently the location of the loop 5 of the tunnel-form magnetic field H is shifted over the sputter surface 1.

Other structural forms, in particular for large, rectangular targets, are known, in which a pendulum-type shifting of the location of highest plasma density takes place thereby that magnet rollers operated in pendulum-type movement, shift the apex or the base of the tunnel-form magnetic field H back and forth in pendulum movement. In all listed structural forms the additional control according to the present invention can be applied.

In FIGS. 11(a) and 11(b) a magnetron source according to the invention is depicted in top view with a slightly kidney-shaped outer permanent magnet collar $9_{au}$ and eccentrically with respect to center Z of the circular target configuration 3, as well as with an inner magnet collar $9_i$ of pronounced kidney shape and encircling the center Z disposed on the outside. In region $B_1$ a control magnet configuration (not shown) operating according to FIG. 3 is provided according to the invention, preferably developed as was explained in conjunction with FIGS. 7 to 10. The "hose" of high plasma density resulting in the loop 5 of the tunnel-form magnetic field H, as is evident when viewing the two FIG. 11, with the aid of the control according to the invention is reversed in region $B_1$ with respect to its shape according to (a) and (b), on the magnetic collar configuration and control magnet configuration rotating about the center Z, as depicted with Ω. Since the driving region $B_1$ is remote from the discharge anode (not shown), it is here readily possible to carry out the reversing continuously. This applies also with respect to the following FIG. 12.

Figure 12B:
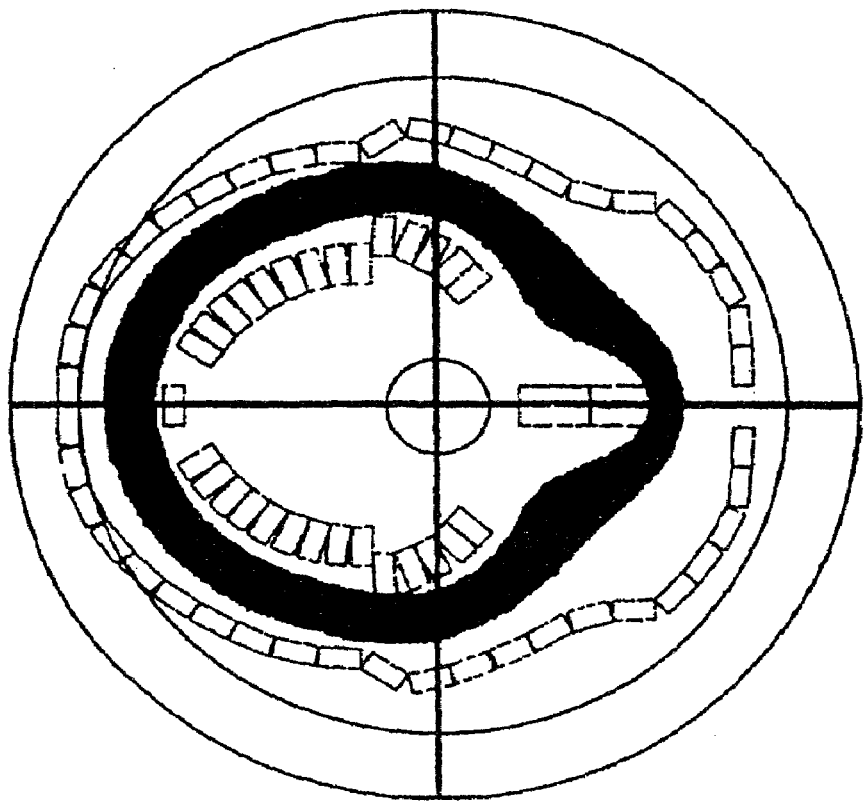
Figure 12A:
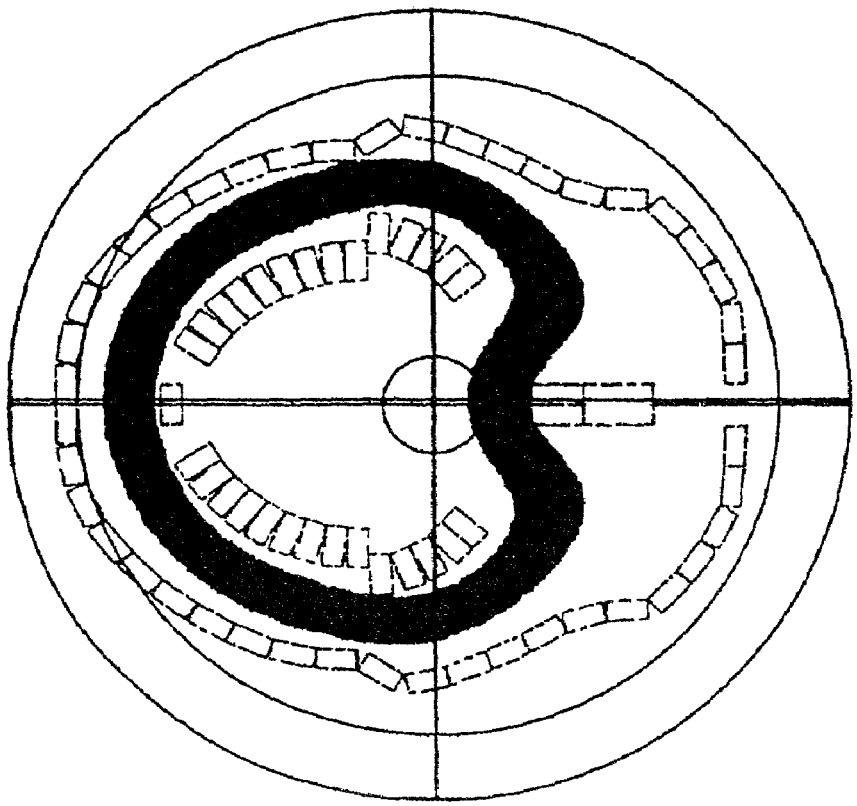
Figure 13:
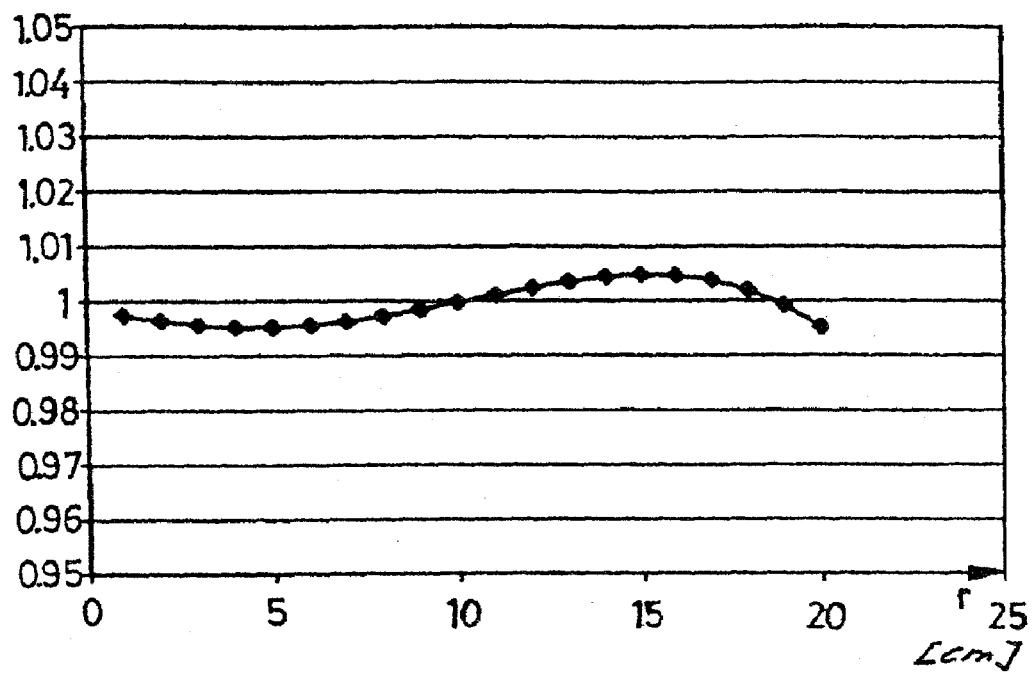
FIGS. 13 to 16 are diagrammatic illustrations of examples of layer thickness distributions on substrates realized with the process according to FIG. 11 or 12.
Figure 14:
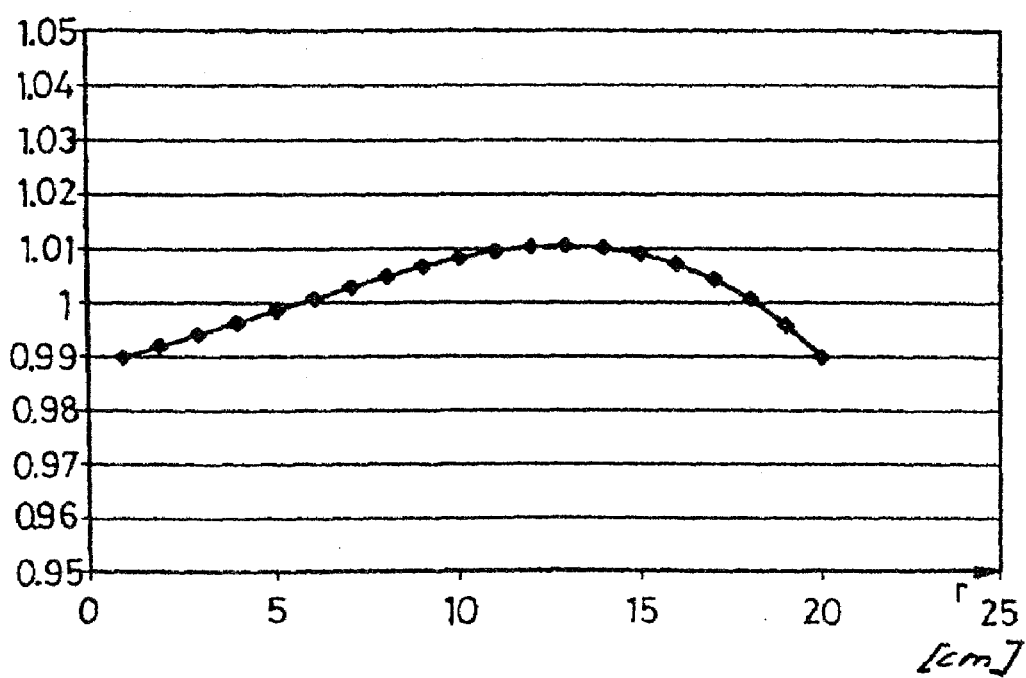
Figure 15:
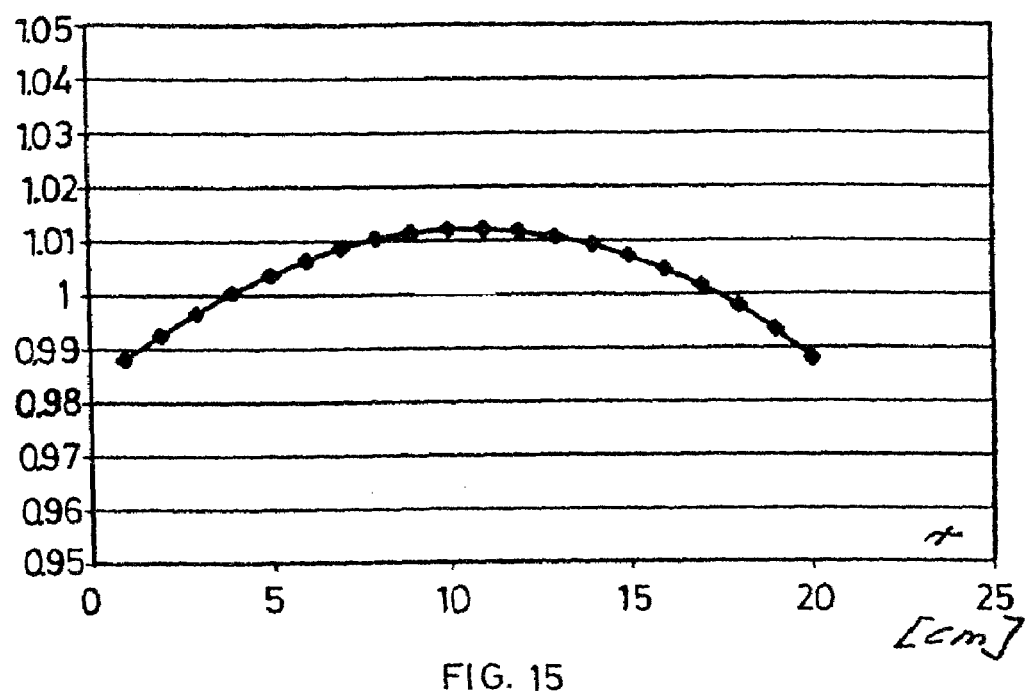
Figure 16:
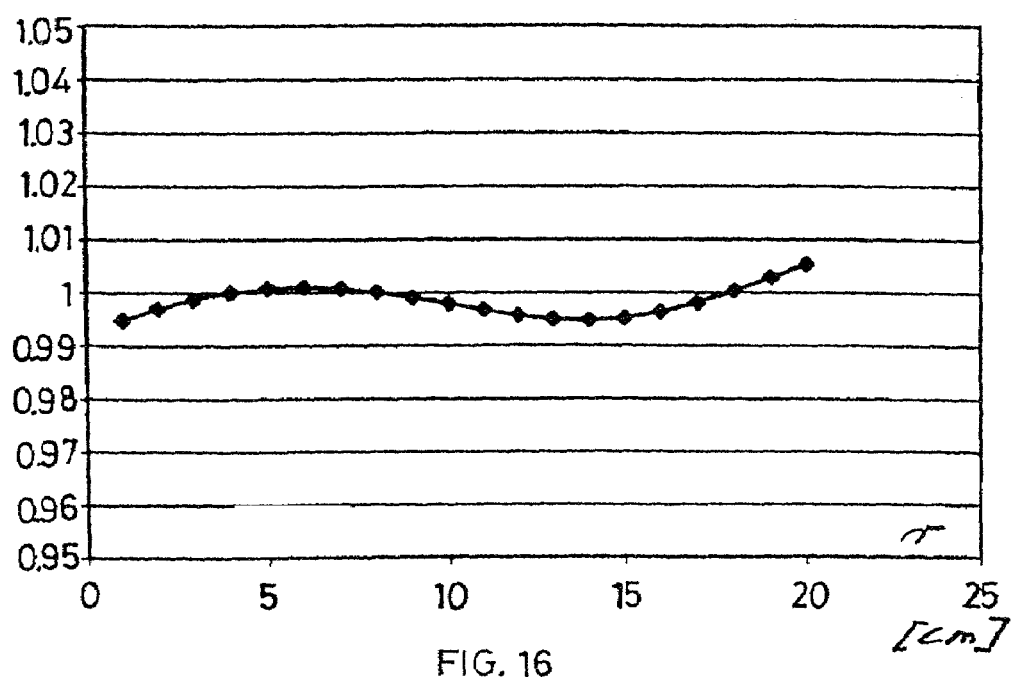

In FIGS. 12(a) and 12(b) a further reversed source configuration according to the invention is shown in analogy to FIGS. 11(a) and (b), in FIGS. 13, 14, 15 and 16 the attained or selected layer thickness distributions depending on the driving of the sources according to FIG. 11 or 13, on a particular planar coated substrate normalized to the nominal thickness.

In the embodiments according to FIGS. 11 and 12 the particular electron trap is varied locally in a region $B_1$, which is remote from anodically operated parts. Therefore less a variation of the electron trap effect per se takes place but rather the electron trap is reshaped.

Through the time-controlled reshaping of the electron trap, for example according to a temporal control program, the sputtering distribution on the sputter surface can additionally be optimized.

Figure 17:
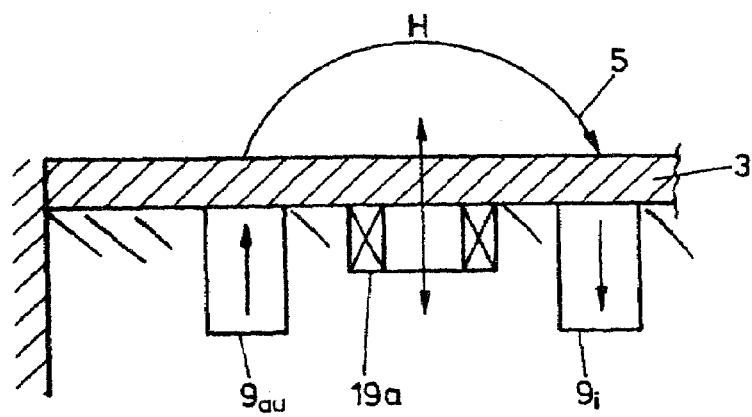
FIG. 17 is a schematic illustration building on a realization of a sputter source according to the invention according to FIG. 3, of a further realization option.

In particular if loop 5 of the tunnel-form magnetic field over the sputter surface is not moved, instead of, or in addition to a control permanent magnet configuration, moved under mechanical control beneath the target configuration 3, as shown in FIG. 17, an electromagnet configuration 19a can be provided locally in order to change according to the invention the tunnel-form field H.

Figure 18:
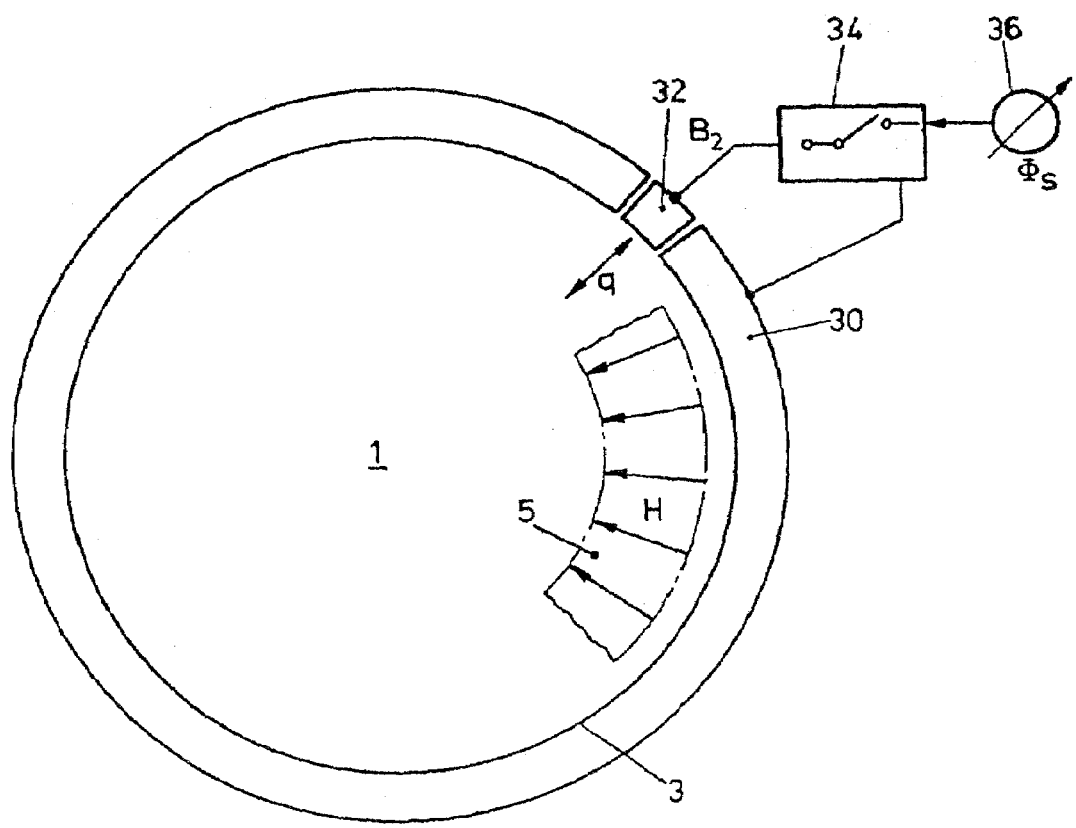
FIG. 18 is a schematic top view building on the principle of a sputter source according to the invention according to FIG. 5.

Especially if the loop 5 of the tunnel-form magnetic field is stationary over the sputter surface 1, the embodiment variant, depicted schematically in FIG. 18, is also suitable for the realization of the present invention under its first formulation. The target configuration 3 with the sputter surface 1 is electrically insulated encompassed by an anode ring 30. Between anode ring 30 and sputter surface 1 as the cathode surface, the electric field E results, which is drawn by example in FIG. 1. In a region $B_2$ also according to FIG. 1, a control anode 32 is provided. As indicated schematically with options changeover switch 34, the control anode 32 is mechanically moved toward or into the magnetic field loop 5 or retracted—q— and/or connected stationarily with a control source 36 to potential $\phi_S$ which is variable under control. Thereby the embodiment is realized which is shown schematically in FIG. 5.

This process, if appropriate in combination with a local variation—resulting with a shift—of the magnetic field H can especially be employed even if with a loop 5, moved during operation with respect to the sputter surface 1, of the tunnel-form magnetic field H, if in the center region Z of the target configuration (not shown) a control electrode analogous to the control electrode 32 of FIG. 18 can be installed.

Figure 19:
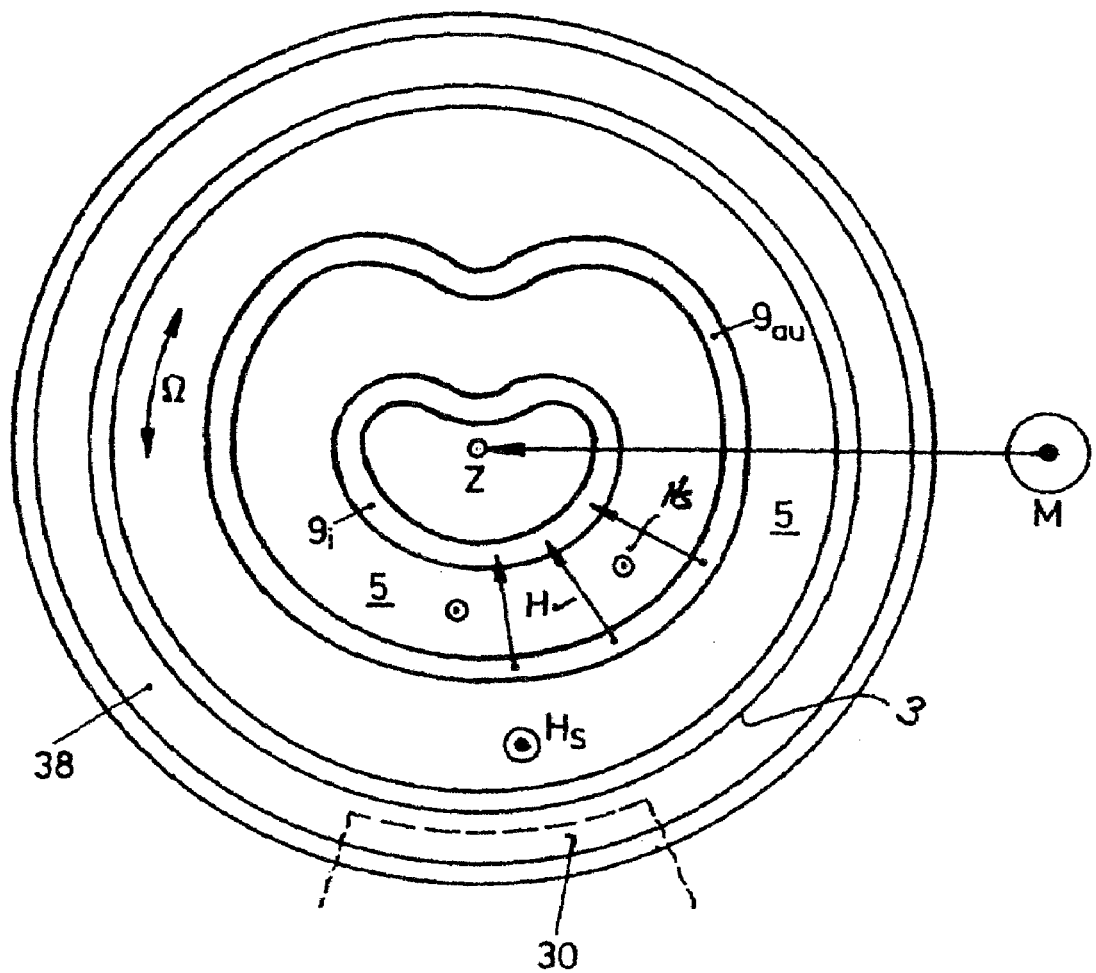
FIG. 19 is a schematic top view of a magnetron sputter source according to the invention, in which the process according to the invention is realized under its second formulation according to FIG. 6.

In FIG. 19 is depicted an embodiment variant according to the second formulation of the present invention previously explained in conjunction with FIG. 6. This is only by example a magnetron source, in which the loop 5 of the tunnel-form field H built up between permanent magnet collars $9_{au}$ and $9_i$ is moved during operation driven under control about the center Z of target configuration 3, as shown schematically with drive M. The control magnetic field $H_S$, already explained in conjunction with FIG. 6 and superimposed on the tunnel-form magnetic field H, is generated for example by a Helmholtz coil 38 provided stationarily and peripherally at the source. With this field $H_S$ the expansion of the tunnel can be controlled and at a corresponding disposition with respect to the anode (dashed at 30) can be drawn into it, which, again, yields the desired massive disturbance effect of the electron trap effect.

Figure 20:
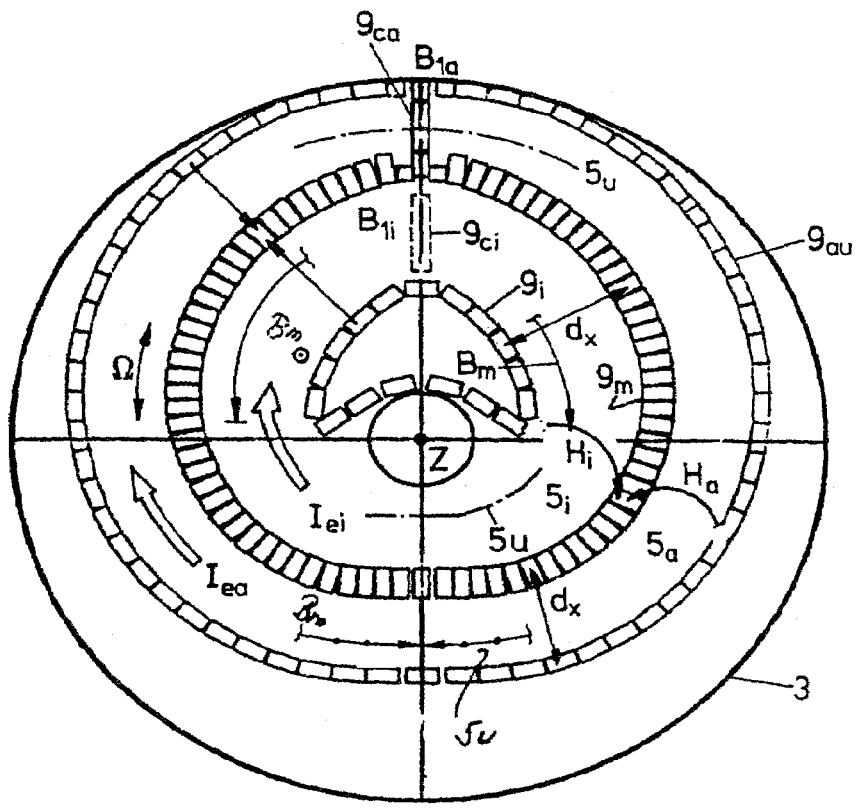
FIG. 20 is a top view of the magnet collar configuration of a magnetron sputter source according to the invention of a further embodiment.
Figure 21A:
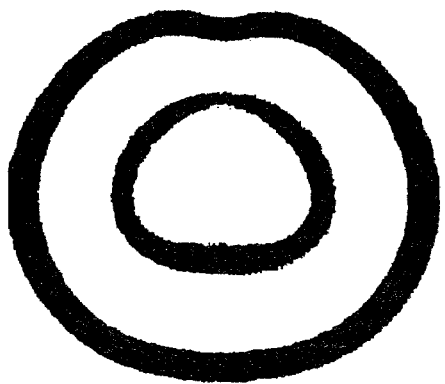
FIGS. 21(a) and 21(b) illustrate the effects onto the plasma density distribution of the control according to the invention provided at the source according to FIG. 20.
Figure 21B:
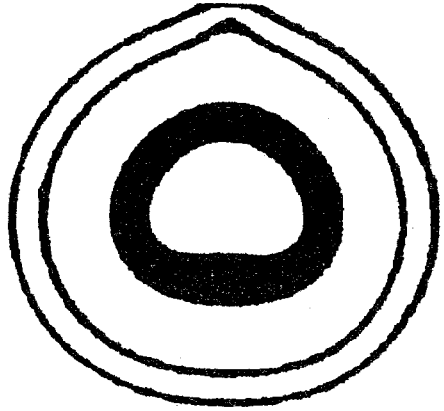

In FIG. 20 in top view the permanent magnet collars $9_{au}$, $9_m$, $9_i$ are depicted for the realization of two loops $5_a$, $5_i$ of the tunnel-form magnetic field $H_a$, and $H_i$. The permanent magnet collars—as shown with Ω—are rotated on the source, here shown by example, about the center Z of the target configuration 3 formed as a circular disk. In the regions $B_{1a}$ and/or $B_{1i}$ control magnet configurations $9_{ca}$ or $9_{ci}$ are provided in analogy to FIG. 3, preferably structured in a manner explained in conjunction with FIGS. 7 to 10. In FIGS. 21(a) and 21(b) the effect of the control magnet configuration $9_{ca}$ according to FIG. 20 is shown. If through this configuration $9_{ca}$ the outer electron trap in the anode-proximal region is disturbed (transition from FIGS. 21(a) to 21(b)), a decisive increase of the plasma impedance results therein. The discharge current commutates into the inner electron trap with loop $5_i$. Therewith the process according to the invention not only the plasma density or distribution is driven in an annular zone corresponding to a loop 5 of the tunnel-form magnetic field, but rather the distribution of the plasma density between two and more such loops $5_i$, $5_a$ (with current $I_{ea}$ in region $B_{no}$).

Figure 22:
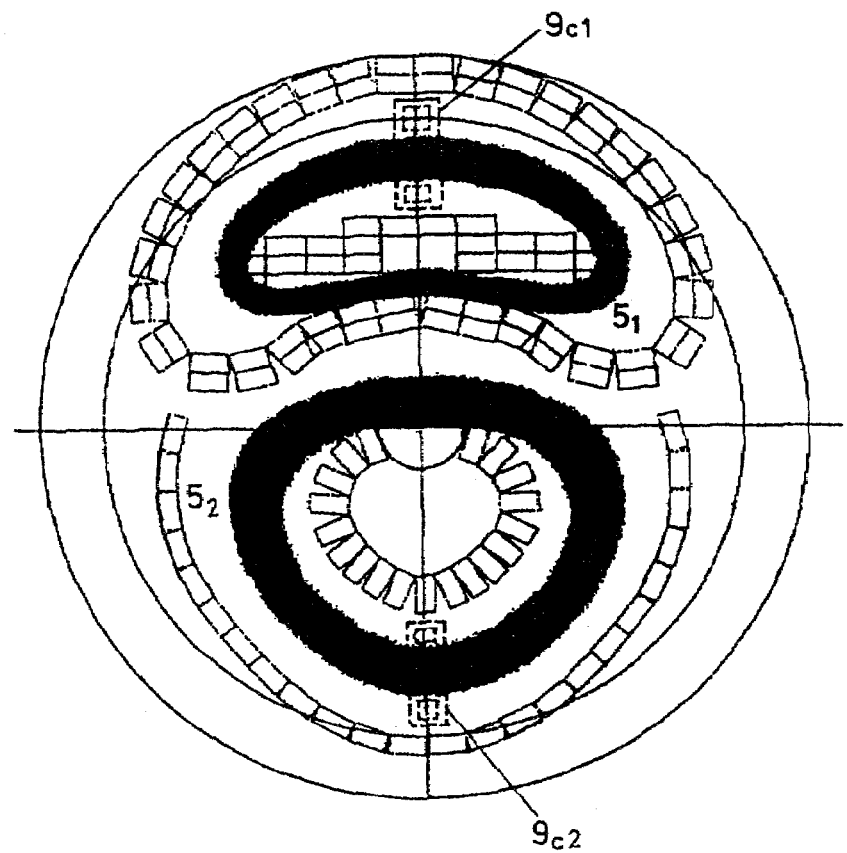
FIG. 22 is a top view of, in a representation analogous to FIG. 11 or 13, a further embodiment of a magnetron source according to the invention drivable according to the invention, and FIGS. 23(a) and 23(b) illustrated the effects of the driving according to the invention onto the plasma density distribution at a magnetron source according to the invention structured substantially according to FIG. 6 or 19.

In a representation analogous to that of FIG. 21, in FIG. 22 is shown the way in which the two loops $5_1$, $5_2$ provided by example of tunnel-form magnetic fields can be disposed not as shown in FIG. 21 one within the other but rather next to one another and, by providing control magnet configurations $9_{c1}$ and/or $9_{ca}$ as indicated only by example in dashed lines, the way in which the plasma density distribution between the two loops $5_1$ and $5_2$ can be varied.

Figure 23A:
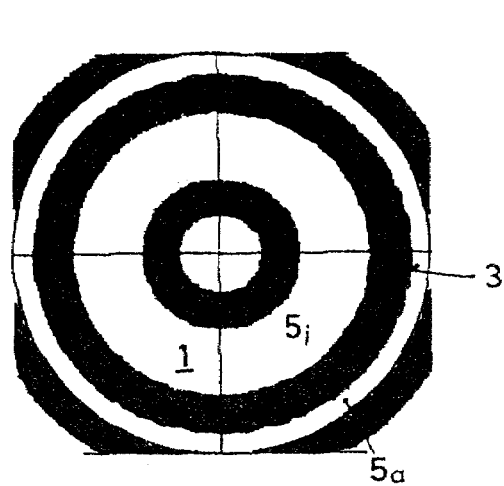
Figure 23B:
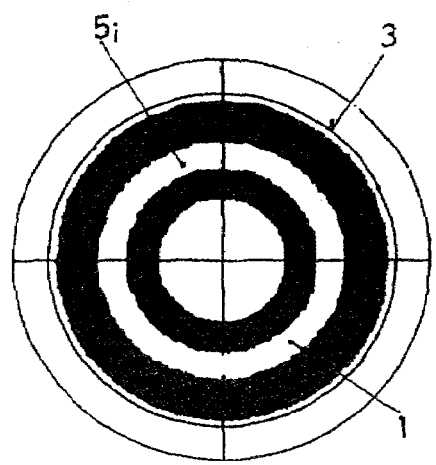

In FIGS. 23(a), 23(b) the effect is depicted of the embodiment of the invention explained in conjunction with FIG. 6 as well as FIG. 19 under its second formulation. Therein two concentric loops $5_a$, $5_1$ of tunnel-form magnetic fields are realized. By driving the superimposed magnetic field $±\Delta_S'H$ according to FIG. 6, preferably by means of the Helmholtz coil configuration 38 explained in conjunction with FIG. 19, the outer loop $5_a$ (transition from FIG. 23(a) to FIG. 23(b)), is radially broadened outwardly into the anode and therewith the magnetic field H jointly forming the electron trap: the outer loop $5_a$ is more and more cut into by the anode (not shown) on the periphery of the target configuration 3, the plasma discharge there is extinguished since the electrons are more and more drawn off at the peripheral anode of the plasma discharge gap. Through said commutation an inner loop $5_1$ or inner electron trap remains of increased plasma density of discharge power. This causes a dislocation of the sputter zone and therewith of the distribution of the coating rate. Consequently, the sputter rate distribution over the sputter surface can here also be adjusted under control.

In FIG. 20 in an embodiment example in practice is entered in dot-dash line said reference variable "average periphery" $5u$ as well as the local pole region distance $d_x$.

The average perimeter $5u$ is obtained from the averaged length of the permanent magnet collars $9_{au}/9_m$ or $9_m/9_i$, defining together an electron trap, while the average pole region distance results from the averaging of the pole region distances $d_x$, averaged on regions $B_m$, on which the permanent magnet collars extend at least approximately parallel.

A further highly positive effect of the present invention now becomes evident.

If on the magnetron source according to the invention two or more magnetic fields circulating in the form of a tunnel, circulating in the form of a loop are provided, each of which acts primarily in zones of different materials of the target configuration, by applying the control according to the invention it becomes possible to control the sputter rate distribution of the two or more materials over time and therewith the coating rate distribution from these materials on a workpiece or substrate in the case of nonreactive as well as also of reactive coating methods.

For defining the preferred local regions $B_1$ or $B_2$ according to FIG. 1, in the introduction their length $I_B$, on the one hand, was related to the average perimeter of the particular electron trap or its closed loop of the tunnel-form magnetic field (in top view), as well as to the particular pole region distance d.

While specific embodiments of the invention have been shown and described in detail to illustrate the application of the principles of the invention, it will be understood that the invention may be embodied otherwise without departing from such principles.

What is claimed is:

1. Magnetron source, comprising a target configuration with a sputter surface, a magnet configuration generating above said sputter surface a magnetic field which forms, in top view onto said sputter surface, at least one magnet field loop and, viewed in a cross-sectional direction upon said target configuration, a tunnel-shaped arc magnet field and further comprising an electrode configuration which generates, when supplied by a positive electric potential with respect to an electric potential applied to said target configuration, an electric field which crosses at an angle to said magnetic field of said at least one magnet field loop and wherein said electrode configuration comprises a distinct electrode arrangement in a limited segment area of said electrode configuration, which is substantially shorter than the overall length of said magnet field loop, said electrode arrangement along said limited segment area being electrically isolated from the remainder of said electrode configuration so as to be electrically operated differently than the remainder of said electrode configuration.

2. Magnetron source, comprising a target configuration with a sputter surface, a magnet configuration generating above said sputter surface a magnetic field which forms, in top view onto said sputter surface, at least one magnet field loop, and, viewed in a cross-sectional direction upon said target configuration a tunnel-shaped arc magnetic field with a tunnel-shaped bend between two magnetic polarity footprint areas, and further comprising an electrode configuration which generates, when supplied by a positive electric potential with respect to an electric potential applied to said target configuration an electric field which crosses at an angle to said magnetic field of said at least one magnet field loop, said magnet configuration further comprising a magnet arrangement, generating along a limited segment of said magnet field loop a magnetic field at one polarity footprint area, which is different from the magnetic field generated along the remainder of said footprint area generated by said magnet configuration.

3. Magnetron source, comprising a target configuration with a sputter surface, a magnet configuration generating above said sputter surface at least one magnetic field which forms in top view onto said sputter surface at least one magnetic field loop and, viewed in a cross-sectional direction upon said target configuration, a tunnel-shaped arc magnet field and further comprising an electrode configuration which generates, when supplied by a positive electric potential with respect to an electric potential applied to said target configuration, an electric field which crosses at an angle to said magnetic field of said magnet field loop and further comprising a shunting member for shunting said magnet field in a limited segment area along said magnet configuration, said segment having an extent $I_B$ selected to be $$0 < I_B \leq 4d$$

wherein d stands for the average distance of footprint areas of polarity of said tunnel-shaped magnet field generated by said magnet configuration on said sputter surface.

4. Magnetron source, comprising a target configuration with a sputter surface, a magnet configuration generating above said sputter surface a magnetic field which forms, in top view onto said sputter surface at least one magnet field loop and, viewed in a cross-sectional direction upon said target configuration, a tunnel-shaped arc magnet field, and further comprising an electrode configuration, which generates, when supplied by a positive electric potential with respect to an electric potential applied to said target configuration, an electric field which crosses at an angle to said magnetic field of said magnet field loop, further comprising a mechanical member in a segment area of said magnet field loop, said segment having an extent $I_B$ selected to be $$0 < I_B \leq 4d$$

wherein d stands for the average distance of footprint areas of polarity of said tunnel-shaped magnet arc field on said sputter surface, said mechanical member interacting with at least one of said magnetic field and of said electric field in said segment area.

5. Magnetron source as claimed in claim 4, wherein $$0 < I_B \leq 2d.$$

6. Magnetron source as claimed in claims 4, wherein the electrode configuration comprises at least one Helmholtz coil configuration.

7. Magnetron source as claimed in claims 4, wherein the mechanical member comprises one of: electromagnet configuration; and a permanent magnet configuration movable under mechanical control; and a ferromagnetic shunt configuration movable under control.

8. Magnetron source as claimed in claim 7, wherein the mechanical member comprises at least one magnet cylinder support to be rotationally movable under driving.

9. Magnetron source as claimed in claim 8, including a driving device for the magnet cylinder comprising a coil configuration, whose field acts onto a magnetic dipole of the magnet cylinder.

10. Magnetron source as claimed in claim 4, wherein the magnet configuration, which generates the magnetic field emerging and entering again in the form of a tunnel from/into the sputter surface is movable under driving with respect to the target configuration, and the mechanical member is coupled with the magnet configuration movement.

11. Magnetron source as claimed in claim 4, wherein more than one of the magnet configuration is provided, each of which generates a magnetic field which emerges in the form of a tunnel from the sputter surface and enters into the sputter surface again.

12. Magnetron source as claimed in claim 4, with at least two of the magnet configurations, each of which forms a magnetic field emerging in the form of a tunnel from the sputter surface and entering into it again, and wherein the sputter surface in the region of said magnetic fields is comprised of different materials.

13. Magnetron source as claimed in claim 4, wherein the mechanical member comprises an anodic electrode, which is mechanically slid into and out of the field loop.

14. A method for manufacturing magnetron sputter coated workpieces, comprising the steps of:
   applying a substrate to be magnetron sputter-coated adjacent a magnetron source having a target cathode arrangement;
   generating above said target cathode arrangement at least one plasma loop by means of an electron trap established by generating on one hand a magnetic field which forms, in top view onto the target cathode arrangement, a magnet field loop and, viewed in a cross-sectional direction upon said target cathode arrangement, a tunnel-shaped arc magnet field and, on the other hand, an electric field which crosses at an angle to said magnet field of said magnet field loop; and
   establishing above said target cathode arrangement in a limited area along said plasma loop an area being substantially shorter in direction of said plasma loop than the extent of said plasma loop and superimposing in said limited area a further magnetic field to said magnetic field, thereby rotating said limited area about a center.

15. A method for manufacturing magnetron sputter-coated workpieces comprising the steps of:
   applying a substrate to be magnetron sputter-coated adjacent a magnetron source having a target cathode arrangement;
   generating above said target cathode arrangement at least one plasma loop by means of an electron trap established by generating, on one hand, a magnetic field which forms, in top view onto the target cathode arrangement, a magnet field loop and, viewed in a cross-sectional direction upon said target cathode arrangement, a tunnel-shaped arc magnet field with a tunnel-shaped bend between two magnetic polarity footprint areas and, on the other hand, an electric field which crosses at an angle to said magnetic field of said magnet field loop and further establishing at only one polarity footprint area of said tunnel-shaped arc field and only in a limited segment along said plasma loop, a strength of magnetic field which is different from the strength of said magnetic field along the remainder of said magnet field loop, thereby selecting said segment to be substantially shorter in direction of said plasma loop, than the extent of said plasma loop.

* * * * *